US009699580B2

(12) United States Patent
Bhogal et al.

(10) Patent No.: US 9,699,580 B2
(45) Date of Patent: Jul. 4, 2017

(54) ELECTRONIC MEDIA VOLUME CONTROL

(71) Applicant: International Business Machines Corporation, Armonk, NY (US)

(72) Inventors: Kulvir S. Bhogal, Fort Worth, TX (US); Jonathan F. Brunn, Logan, UT (US); Jeffrey R. Hoy, Gibsonia, PA (US); Asima Silva, Holden, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/867,033

(22) Filed: Sep. 28, 2015

(65) Prior Publication Data

US 2017/0094434 A1 Mar. 30, 2017

(51) Int. Cl.

*H03G 3/00* (2006.01)
*H04R 29/00* (2006.01)
*H04S 7/00* (2006.01)

(52) U.S. Cl.

CPC ......... *H04R 29/001* (2013.01); *H04R 29/008* (2013.01); *H04S 7/303* (2013.01); *H04R 2430/01* (2013.01)

(58) Field of Classification Search

CPC . H04R 29/001; H04R 29/008; H04R 2430/01
USPC ...................................... 381/104-109, 56-59
See application file for complete search history.

(56) References Cited

U.S. PATENT DOCUMENTS 8,451,102 B2 5/2013 Epley
8,542,817 B1 9/2013 Short et al.
2008/0226087 A1* 9/2008 Kinghorn ................ H04S 7/301 381/59
2015/0264507 A1* 9/2015 Francombe ............. H04S 7/301 381/303
2016/0073210 A1* 3/2016 Sheen .................. H04R 29/001 381/59
2016/0149547 A1* 5/2016 Rider ....................... H03G 3/04 381/57

FOREIGN PATENT DOCUMENTS

EP 2582045 A1 4/2013

OTHER PUBLICATIONS

Anonymous, "A Method to Detect and Control Audible Noise that is Emitted from Electronic Devices", An IP.com Prior Art Database Technical Disclosure, IP.com Electronic Publication: Apr. 27, 2012, 3 pages, IP.com No. IPCOM000217031D.
Anonymous, "Anonymous messaging to reduce noise pollution of other devices", An IP.com Prior Art Database Technical Disclosure, IP.com Electronic Publication: Sep. 14, 2010, 3 pages, IP.com No. IPCOM000199686D.

* cited by examiner

*Primary Examiner* — Disler Paul
(74) *Attorney, Agent, or Firm* — Robert J. Shatto

(57) ABSTRACT

The volume of a sound generated from a source is monitored. Contextual data is collected from sensors. Based on the collected contextual data listeners of the sound are identified. The identified listeners are grouped into listeners that are bothered by the sound and listeners that are unbothered by the sound. An acceptable range for the volume of the sound is determined based on the bothered listeners and the unbothered listeners.

18 Claims, 6 Drawing Sheets

ELECTRONIC MEDIA VOLUME CONTROL

BACKGROUND

The present disclosure relates to electrical audio signal processing systems and devices, and more specifically, to volume control.

Volume control is the intentional alteration of sound. The sound can be generated from an electronic media device. As volume may be electronically represented in either digital or analog format, volume control can occur in either domain. Sound waves are measured in decibels. Sound waves—longitudinal waves which travel through air can be altered so that their projection through space can increase in some areas of space and decrease in other areas of space. The projection of the sound waves through space can depend on the nearby environment, more specifically a shape and material that comprises the nearby environment. The sound waves can be monitored by electrical instruments in order to increase accuracy of the projection. The nearby environment can change over a period of time and this change can be monitored.

SUMMARY

Aspects of the present disclosure are directed towards a computer-implemented method of monitoring volume of a sound. In embodiments, the sound can be generated from a source. In embodiments, the method can further include collecting contextual data from sensors. In embodiments, the method can further include identifying, based on the collected contextual data, listeners of the sound. In embodiments, the method can further include grouping the identified listeners into listeners that are bothered by the sound and listeners that are unbothered by the sound. In embodiments, the method can further include determining, based on the bothered listeners and the unbothered listeners, an acceptable range for the volume of the sound.

Aspects of the present disclosure are directed towards a system for monitoring a volume of a sound. In embodiments, the system can include a processor and a computer readable storage medium having program instructions embodied therewith. In embodiments the program instructions can be executable by the processor to cause the system to monitor volume of a sound. In embodiments, the sound can be generated from a source. In embodiments, the system can further collect contextual data from sensors. In embodiments, the system can further identify, based on the collected contextual data, listeners of the sound. In embodiments, the system can further group the identified listeners into listeners that are bothered by the sound and listeners that are unbothered by the sound. In embodiments, the system can further determine, based on the bothered listeners and the unbothered listeners, an acceptable range for the volume of the sound.

Aspects of the present disclosure are directed towards a computer program product for monitoring the volume of a sound. The computer program product comprises a computer readable storage medium having program instructions embodied therewith. The computer readable storage medium is not a transitory signal per se. The program instructions are executable by a computer to perform a method. In embodiments, the method can include monitoring volume of a sound. In embodiments, the sound can be generated from a source. In embodiments, the method can include collecting contextual data from sensors. In embodiments, the method can further include identifying listeners of the sound based on the collected contextual data. In embodiments, the method can further include grouping the identified listeners into listeners that are bothered by the sound and listeners that are unbothered by the sound. In embodiments, the method can further include determining an acceptable range for the volume of the sound based on the bothered listeners and the unbothered listeners.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
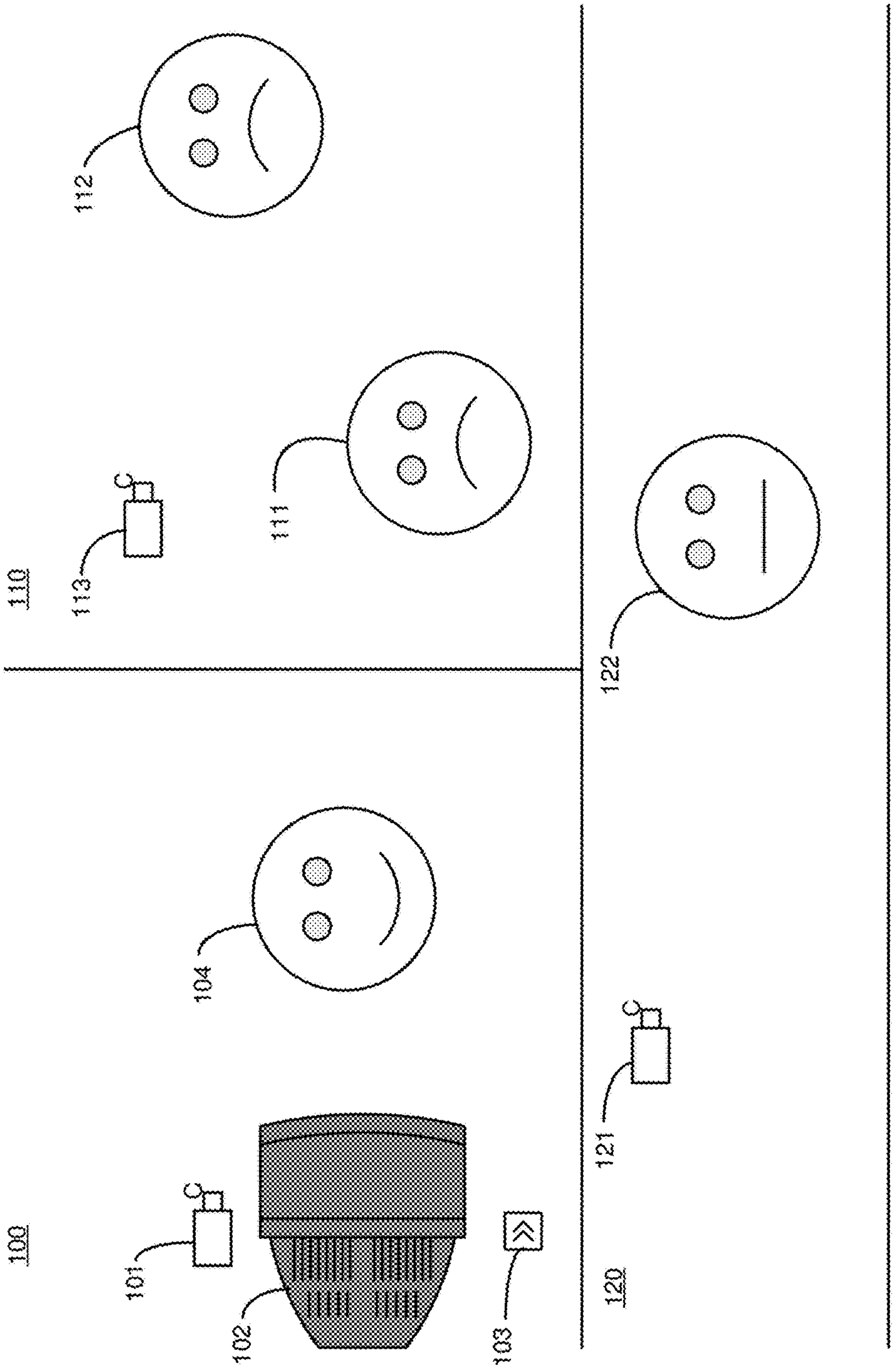
FIG. 1 depicts an electronic media device within a hotel room utilizing aspects of the present of the disclosure, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electrical audio signal processing systems and devices, more particular aspects relate to volume control. While the present disclosure is not necessarily limited to such applications, various aspects of the disclosure may be appreciated through a discussion of various examples using this context.

Volume control and noise pollution are an increasing problem in public areas, especially as mobile devices proliferate. Common situations of noise pollution occur where noise impacts one person, and there may not be a current method of volume control. Furthermore, there may not even be a method or way for feedback from a person bothered by the noise pollution to reach the owner of the device. For example, noise can be generated from loud headphones on an airplane, a loud television in a hotel, and a loud stereo in a car. In these situations the owner of the device may be entirely unaware that they are affecting nearby people, and, furthermore, since there may be legitimate times when these devices are loud, a blanket volume cap may not be a great option. Manual volume control by a user may even be difficult in some of these situations, for example in a hotel room where the user may be unaware of guests occupying nearby and adjacent rooms. Embodiments of the present disclosure can monitor a nearby environment, then send feedback to an owner of a device in order to determine the number of bothered and unbothered listeners, so that the volume of the sound can be modulated.

At a high level, aspects of the present disclosure can, in some embodiments, continually monitor nearby listeners using a variety of sensors; differentiate a number of bothered listeners versus unbothered listeners; modulate volume to balance needs of the bothered listeners against unbothered listeners; present visual and audio queues to a user to indicate when the user's volume may be bothering others; and, present a visual indication of a maximal tolerable volume. Furthermore, embodiments of the present disclosure can aggregate estimated listeners; differentiate between bothered listeners versus unbothered listeners based on contextual data that the sensors can collect; transmit feedback to the listener with noise impact and volume thresholds; and control a volume of the sound that an electronic media device can generate based on the detected nearby listeners.

Aspects of the present disclosure can, in some embodiments, integrate with an electronic media device, for example a television, sound system, home entertainment system, mobile device, or portable electronic device. The system can continually collect as input, via sensors, a number of listeners in an area nearby the electronic media device. Aspects of the present disclosure can also further integrate sound sensors into the electronic media device, in order to determine impact of the volume of the sound being generated from the electronic media device, for example, to account for an open or shut door in a room. The system may need to account for double-counting impacted listeners. This can be done, in some embodiments, by listener identification and position, if available, or by analyzing context to increase the likelihood that sensor counts do not overlap. Each of the sensors can be communicatively coupled to decrease the likelihood of double counting. The system can incorporate a database in order to determine if a nearby listener is bothered or unbothered. The database can include schematics and floor plans of a building that the system is operating within. For example, the schematics could include a list of rooms that are occupied within a hotel room for a given night, or a blueprint of a building that could include such things as wall thickness and the material of the walls to account for propagation of sound. The system can evaluate bothered listeners versus unbothered listeners (typically 1 unbothered and X bothered, where X can be a positive number).

Differentiating bothered listeners from unbothered listeners can be based on source. For example, listeners detected from a source, e.g. a panoramic 3D camera can be counted as bothered (discounting an owner or user of the device), so the owner could be considered unbothered and all other listeners could be considered bothered. In a second case, the camera can integrate into a system that could be used during a conference or meeting in which case participants in the room could be listed as unbothered listeners. Continuing the second case, a second system could be integrated into a phone of a participant of the meeting, and the second system could list all the participants—including the owner—as bothered. The system can further weight the bothered listeners and unbothered listeners based on a position of the listeners. For example, listeners in a hotel room adjacent to the system may be considered to be more bothered than listeners in a hallway within the same hotel. The system can evaluate a proximity of bothered listeners, and can further integrate microphones to determine the impact of a current volume of the electronic media device. The system can limit the volume of the electronic media device to a maximum tolerable volume based on an impact of the volume on the bothered listeners that can be determined, for example, by modules discussed in FIG. 4.

In some embodiments, the system can integrate with microphones and sensors to re-evaluate impact of a determined volume—determined by the system—as a double check that the system adjusted the volume accordingly based on collected contextual data. The system can continually apply this process. The system can also restore or raise the volume limit, as the impacted listeners or the location of the electronic media device change. For example, the system could raise the volume limit when the schematics of a hotel room changes the listing of an adjacent hotel room from occupied to unoccupied.

A variety of sensors can be used to detect nearby listeners. Detection of ambient noise can be used not only to detect nearby people, but can be used to detect the background level of noise which may mask audio produced by the electronic media device. Detection of nearby people can be based on cell phone signals, radio signals, Wi-Fi signals, etc. Integration of the system can also be utilized with a microphone on a nearby participating mobile device, e.g., a smartphone or a tablet. For example, a bothered user may activate a "mute nearby" option in order to notify nearby systems and provide volume input.

In some embodiments, cameras can be utilized as sensors in order to count the number of people in a room. Cameras can include 3D cameras. The 3D cameras can identify people in a room and determine their positions. Integration with architecture diagrams, such as a hotel schematic, can be used to determine room proximities in order to check for rooms that are occupied. Integration with airline passenger manifest can be used in order to determine which seats on an airplane are occupied. Integration with land plots and neighborhood maps can be used in order to determine or estimate the number of homes nearby. This can be beneficial for a vehicle-based system when driving through a neighborhood. Integration of the system with nearby microphones (preconfigured for the building) and also identification of people based on microphone activity can be beneficial when walking into buildings with a device that includes the system. Other inputs can include the time of day in order to determine impact of noise during nighttime.

Turning now to FIG. 1, aspects of the present disclosure being utilized within a hotel can be seen, according to various embodiments. In some embodiments, the hotel can include two rooms 100 and 110, and a hallway 120. In some embodiments, a first hotel guest 104 can be watching a television 102. The television 102 can generate sound at a volume. The television 102 can include a system that can adjust and modulate the volume of the sound in response to various sensors 101, 103, 113, and 121 that are within the hotel. In some embodiments, the volume of the sound can disturb a second hotel guest 111 and a third hotel guest 112 that are within an adjacent hotel room 110. In some embodiments, a camera 113 within the adjacent hotel room 110 can view the second hotel guest 111 and the third hotel guest 112. In some embodiments, the camera 113 can monitor an area nearby the TV 102. Monitoring can be in the form of collecting contextual data, such as, a hotel guest's facial expressions or a characteristic of a hotel guest, such as, age. In some embodiments, the camera 113 can detect if they are bothered based on the collected contextual data. In some embodiments, the camera 113 can transmit the contextual data in the form of an electrical signal to the television 102 in the hotel room 100. In some embodiments, the electrical signal can express that the second hotel guest 111 and third hotel guest 112 are bothered. In some embodiments, the television can receive the transmitted signal and determine an acceptable volume for the sound. The acceptable volume can be a volume such that the first guest 104 can hear the television, but also so that the second hotel guest 111 and the third hotel guest 112 can be left unbothered by the volume of the sound. In some embodiments, a second camera 101 and an audio sensor 103 can detect the facial expressions of the first hotel guest 104 and the volume of the sound from the television 102. The camera 101 can transmit a second electrical signal to the system within the television 102 that represents the state of the facial expression of the guest 104. The facial expressions of the guest 104 can be taken into consideration when the system determines an acceptable volume of the sound. The acceptable volume can be displayed to the first hotel guest 104.

In some embodiments, television 102 can display a user interface (UI) that represents various levels of an acceptable volume for the hotel guest 104 to watch television 102. In some embodiments, the volume of the sound can be automatically adjusted based on the electrical signals that are from the cameras 101 and 113, and audio sensor 103. In some embodiments, the guest 104 can manually adjust the volume of the sound. In other embodiments, the television can have a maximum tolerable volume (MTV) that the volume of the sound cannot exceed. This MTV can be based on schematics of the hotel that lists the rooms that are occupied and unoccupied. Each hotel room within the hotel can have a different MTV. In yet other embodiments, the nearby environment may not be static, e.g. in the hallway 120.

Continuing from the previous embodiment, the system can continually collect contextual data as listeners and the nearby environment changes. For example, in some embodiments, a fourth hotel guest 122 could be walking in a hallway 120 of the same hotel. The hallway 120 can be outside the first and second hotel rooms 100 and 110, respectively. In some embodiments, the fourth hotel guest 122 could be unbothered or neutral. In some embodiments, the volume of the sound can change from the fourth hotel guest's 122 perspective as he traverses the hallway 120. For example, the volume of the sound generated from the electronic media device 102 can decrease as the fourth hotel guest 122 approaches near a door of the first hotel room 100 and can increase as he 122 is farther away from the door of the hotel room 100. In some embodiments, a third sensor 121 can monitor the trajectory of the fourth hotel guest 122, as well as his facial expressions. Monitoring can include determining a position of the fourth hotel guest 122. The system can extrapolate a distance of the fourth hotel guest 122 from the television based on the monitoring. In some embodiments, the third sensor 121 can transmit the contextual data in the form of an electrical signal to the system within the television 102. The system can determine a volume for the sound of the television 102 so that the fourth hotel guest 122 can remain unbothered as he traverses the hallway 120. The volume of the sound generated from the television 102 can be automatically adjusted based on the determined volume. Aspects of the present disclosure can also be utilized within moving vehicles.

Figure 2:
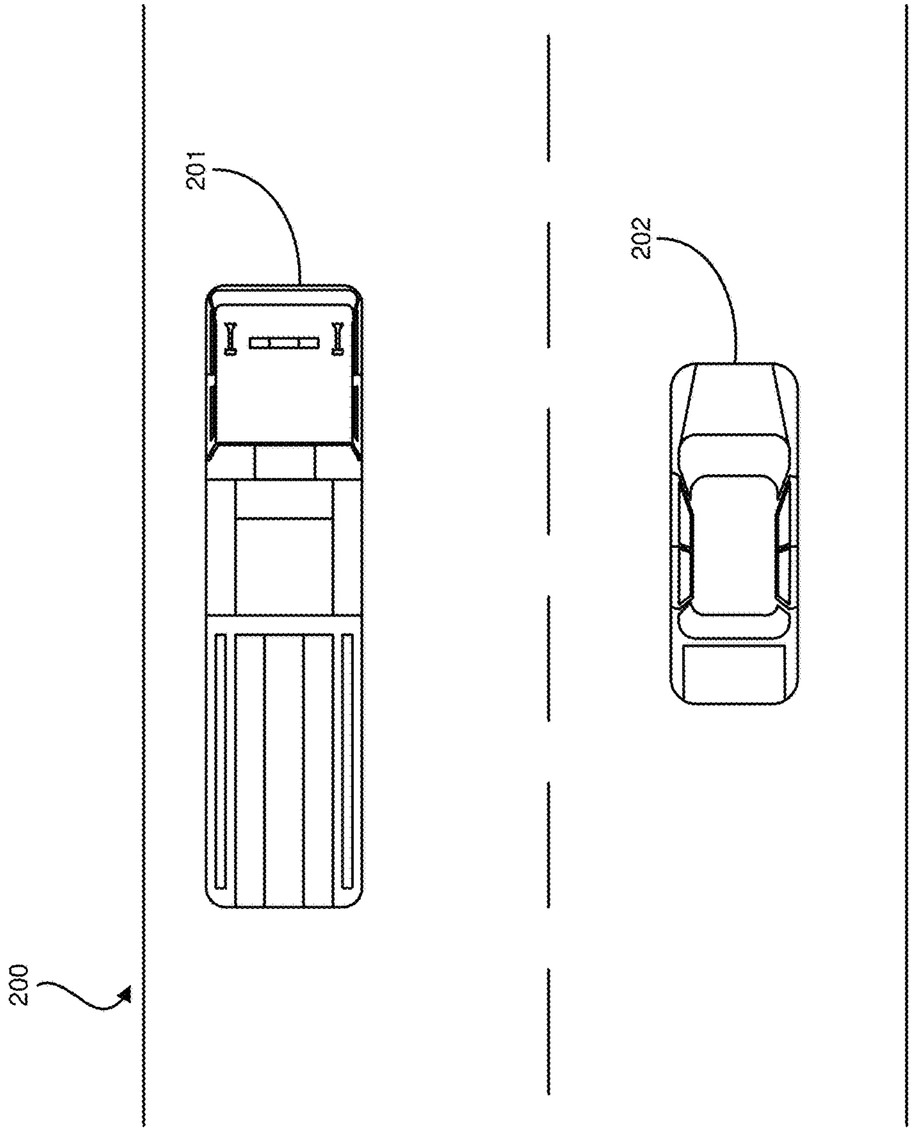
FIG. 2 depicts a vehicle configured to utilize an embodiment of the present disclosure, according to various embodiments.

Turning now to FIG. 2, aspects of the present disclosure being utilized within a moving vehicle 202, in response to a nearby emergency vehicle 201, can be seen, according to various embodiments. In some embodiments, flashing lights and loud sound can prompt the utilization of aspects of the present disclosure. For example, a driver operating the moving vehicle 202 might be playing music at an extremely high volume. The volume could distract the driver. The driver might not be able to see or hear an approaching emergency vehicle 201. A system that includes aspects of the present disclosure could be integrated within the vehicle 202, and could respond to visual and audial warnings projected by the approaching emergency vehicle 201. Sensors that can be communicatively coupled to the system, such as audio and video sensors, can continually collect contextual data, e.g., lights and sound emitted from the emergency vehicle 201. The sensors could transmit the contextual data to the system. The system could then determine an appropriate volume for the vehicle's 202 sound system. The system could also power off the vehicles 202 sound system in response to the emergency vehicle being within a close range of the vehicle. The system could also notify the driver to be aware of the emergency vehicle. The system could further display the geographic location of the emergency vehicle 201 on a map or real time footage of the emergency vehicle 201 via a user interface (UI). The UI could be interactive and continually updated with nearby environmental changes based on sensors collecting contextual data.

The user could be presented with feedback when the volume coming from vehicle 202 has exceeded a level tolerable by others that are nearby. This feedback may be visual or auditory. For example, auditory feedback could be someone verbally expressing distaste for the volume of the sound. For yet another example, the visual feedback could be a facial expression of a nearby listener that could suggest disgust with the volume of the sound. The system could also present visual feedback as part of the electronic media device's volume control. In many cases the system can display to the listener that the volume has been modulated. For example, radio volume could go up or down or be limited, with a corresponding icon to indicate a modulation is due to volume impact. In some embodiments, the display can be an indication to the driver of the vehicle 202 that the volume of the sound is bothering people.

In some embodiments, a display can depict a range for a volume of sound to reside within so that listeners nearby are left unbothered. For example, a linear volume control on a touch screen can show noise thresholds. The threshold could be depicted by different color segments of the volume control that can indicate when volume may likely exceed tolerable levels for listeners nearby. For example, green can indicate a volume that may likely not disturb other nearby listeners, while yellow may indicate disruption of others may be likely, and red could indicate that there may be a high likelihood that the volume of the sound could be bothersome to listeners. A voice overlay, e.g. an audial signal, can also indicate to the user when the volume may become disruptive, and by how much. Alternatively, the UI or voice overlay can simply warn the user that they may have crossed a threshold based on the environment, e.g., when the contextual data suggests that the user is in a meeting or conference. In some embodiments, the system can display to the listener that the volume has been modulated. For example, radio volume could go up or down or be limited, with a corresponding icon to indicate it is due to volume impact.

Figure 3:
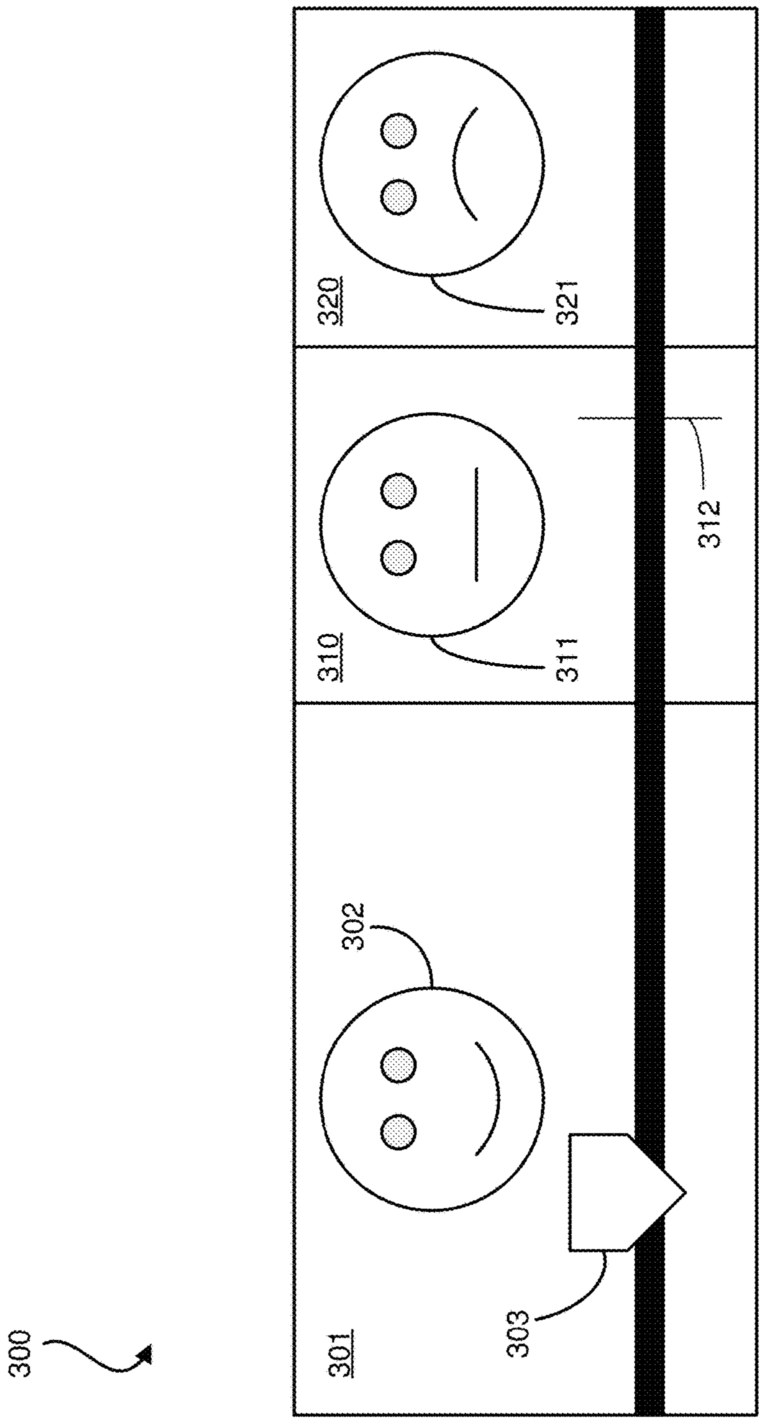
FIG. 3 depicts a visual representation of an acceptable volume based on contextual data collected from remote sensors, according to various embodiments.

Turning now to FIG. 3, a user interface (UI) 300 displaying a range of volumes for sound can be seen, according to various embodiments. An aspect of the present disclosure can be integrated within an electronic media device. The electronic media device, e.g., a TV, can display one or more ranges that the volume can reside within 301, 310, and 320. The one or more ranges can each represent a different level of bothered. In some embodiments, a first range of volume 301 can be a range that the volume of the sound may not likely be bothersome to nearby listeners. The first range 301 can be color coded, e.g., green. In some embodiments, the smiley face 302 can signify that the range may not be bothersome to nearby listeners based on contextual data collected by sensors. In some embodiments, the volume of the sound can be configured, manually by a user or automatically by the system, so that the indicator can stay within the first range. This can be useful for when someone using the electronic media device leaves an area of the device without turning it off.

In some embodiments, the UI 300 can include a second range of volume 310. The second range of volume 310 can be a range where the volume could be slightly bothersome to nearby listeners. The second volume range 310 can be color coded, e.g., yellow. In some embodiments, the neutral face 311 can signify that nearby listeners may not have expressed distaste in the form of a facial expression or verbal outcry, but according to a predetermined model, these listeners could be slightly bothered. The predetermined model can take into account such parameters as thickness of walls that the device is operating within or the distance of the nearby listeners to the device.

In some embodiments, the system can be automatically set by a user so that the volume does not increase beyond the second range 310. For example, the user can set a maximum tolerable volume (MTV) 312 that can act as a threshold to a far end of the second range 310. The MTV can be based on the contextual data. The MTV can be automatically adjusted by the system.

In some embodiments, a third range of volume 320 can be a range that the volume is most likely bothersome to nearby listeners. The third range of volume 320 can be color coded, e.g., red. In some embodiments, the bothered face 321 can signify that nearby listeners are bothered and that they have expressed verbally or by a facial expression that the volume of the sound is bothering them. The verbal expression and the facial expression of the likely bothered listener can be collected by sensors nearby and transmitted to the system in the form of an electrical signal. In some embodiments, the user can automatically preconfigure the system not to enter into the third range 320. This can be accomplished by adjusting the MTV 312. In some embodiments, a volume indicator 303 can indicate the volume and therefore the range that the volume of the sound is currently in. In some embodiments, the UI 300 may be useful in adjusting a volume level of a sound in order to maintain a level of bother caused by the sound.

Figure 4:
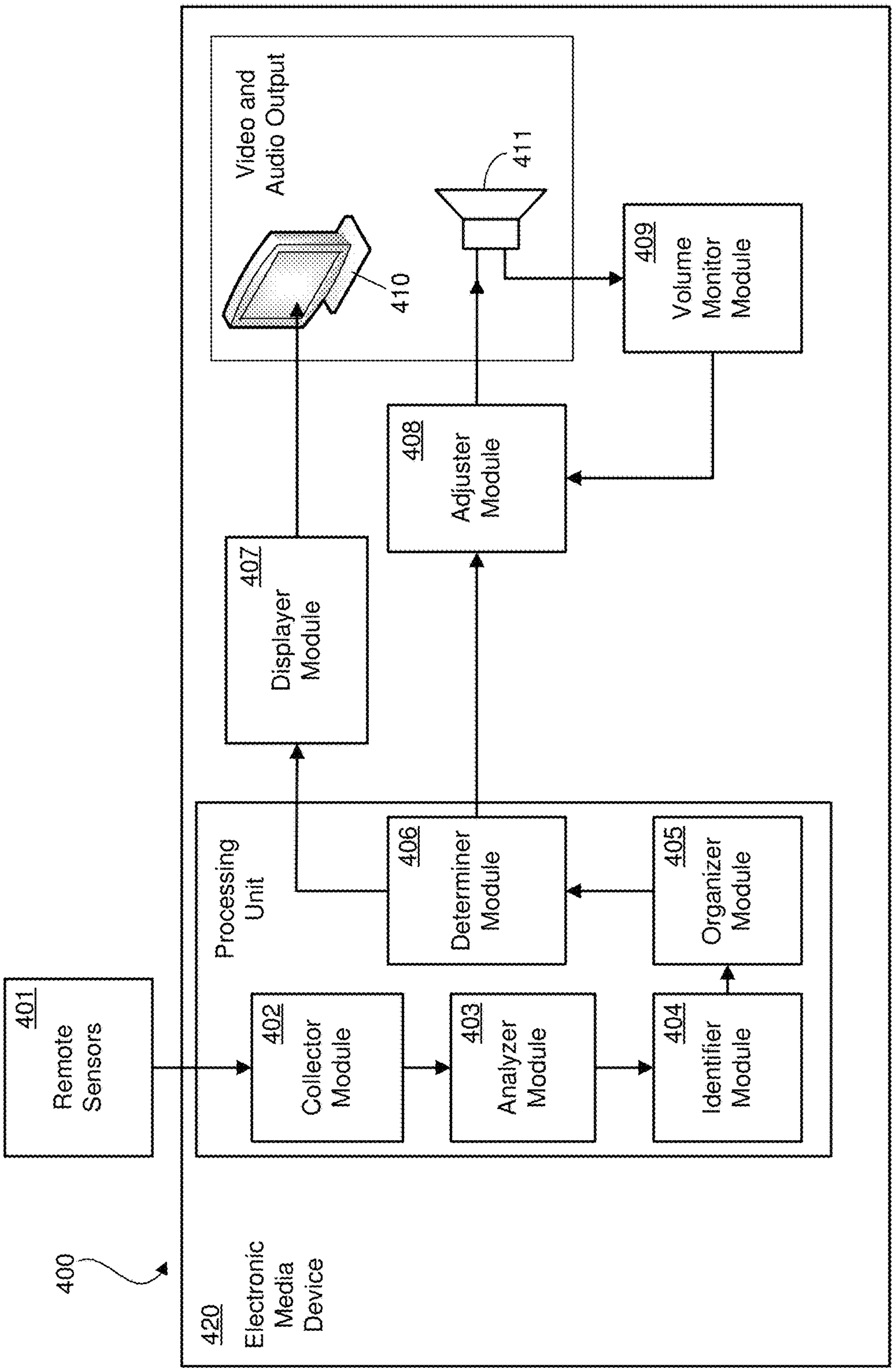
FIG. 4 depicts a system for adjusting a volume of a sound that can be generated from an electronic media device based on contextual data, according to various embodiments.

Turning now to FIG. 4, a diagram of an example system 400 configured to enable aspects of the present disclosure can be seen, according to various embodiments. In some embodiments, one or more remote sensors 401 can collect contextual data near an electronic media system 420. The electronic media system 420 could include an aspect of the present disclosure integrated within its housing. The remote sensors 401 can include, but are not limited to, a camera (two or three dimensional), an audio sensor, and motion sensor. In some embodiments, the sensors 401 can transmit the contextual data to a collector module 402 in the form of an electrical signal. In some embodiments, the collector module 402 can receive the contextual data continuously or in discrete time intervals. In some embodiments, once the collector module 402 has received the contextual data from the remote sensors 401, the remote sensors can then transmit the electrical signal to an analyzer module 403. In some embodiments, the analyzer module 403 can perform basic mathematical techniques to decode the contextual data. For example, the analyzer module 403 can determine the position of listeners nearby the device. In some embodiments, once the analyzer module 403 has analyzed the contextual data, the analyzer module 403 can transmit the analyzed contextual data to an identifier module 404.

In some embodiments, the identifier module 404 can identify listeners that are bothered, unbothered, or neutral. In some embodiments, the identifier module 404 can identify the listeners based on the listener's facial expressions and audial expressions. In some embodiments, the identifier can also identify an age of a nearby listener. The age can be factored in when an acceptable range of the volume is determined. For example, a listener might enjoy music being played at a loud volume when the music is of a genre stereotypically enjoyed by the individuals of the listener's age. More specifically, for example, a sixty-year-old listener may enjoy classic rock at a high volume. For another example, a teenager listener might enjoy current pop music played at a high volume more than a ninety-year-old listener. In some embodiments, the identifier module can relate the position of each of the listeners that are bothered, unbothered, or neutral. In some embodiments, once the identifier module 404 has identified different types of listeners, the identifier module 404 can transmit an electrical signal that includes an analysis of the identified listeners to an organizer module 405.

The organizer module 405 can group the different types of listeners. For example, the unbothered listeners can be grouped together, the neutral listeners can be grouped together, and the bothered listeners can be grouped together. In some embodiments, the organizer module 405 can further weigh each of the listeners according to the position of the listener relative to the electronic media device 420. For example, a listener standing nearby might be weighted more heavily than someone standing far away from the electronic media device. In some embodiments, once the organizer module 405 has grouped and weighted the listeners, the organizer module 405 can transmit that information to a determiner module 406 in the form of an electrical signal. In some embodiments, the determiner module 406 can determine an acceptable volume of a sound to be generated by the electronic media device 420 based on the information that it has received. The acceptable volume can be in units of decibels. In some embodiments, the determiner module 406 can transmit the value of the acceptable volume to a displayer module 407, as well as, an adjuster module 408.

In some embodiments, the displayer module 407 can generate a visual representation that can include a range of volumes for the sound. The visual representation can be displayed within a user interface (UI). This generated UI can be substantially similar to the UI described in FIG. 3. For example, the UI can display within a screen 410 of the electronic media device 420. In some embodiments, the acceptable volume can be indicated within the UI along with a display of the contextual data. In some embodiments, the displayer module 407 can structure an image so that the visual representation fits to the screen 410 of the electronic media device. This structuring capability can be beneficial since not all electronic media devices may have the same screen size.

In some embodiments, the adjuster module 408 can also receive the value of the acceptable volume from the determiner module 406. In some embodiments, the adjuster module 408 can adjust the volume of the sound that can be generated from one or more speakers 411 of the electronic media device 420. In some embodiments, the adjuster module 408 may not automatically adjust the sound. This can be the case when a user sets the electronic media device 420 to a manual mode. A maximal tolerable volume (MTV) can be set by the user or automatically set by the system. In some embodiments, if the volume of the sound reaches an MTV, the adjuster module can override manual mode and automatically lower the volume to a tolerable level. The tolerable level may most likely be within a first range 301 or second range 310 of volume, as discussed in FIG. 3.

In some embodiments, the user can set a preferred range. In some embodiments, the adjuster module 408 can adjust the volume automatically within the preferred range. The user can further determine the preferred range about the acceptable volume. Sensors 401 can further monitor the volume of the sound generated from speakers 411 of the electronic media device 420. This can be helpful for determining the effect of the volume of the sound on the nearby environment for different types of genres. For example, the volume of an action movie can be much more abrasive than the volume of a romantic movie. This can also be beneficial for determining that the outputted volume is in fact substantially close to the acceptable volume.

In some embodiments, the speaker 411 can have an output. In some embodiments, the output can be connectively coupled with a volume monitor module 409. In some embodiments, the volume monitor module 409 can monitor the volume of the sound emitted from the speakers 411. The volume monitor module 409 can determine the effect of the volume of the sound within a room that the electronic media device 420 is operating in. The volume monitor module 409 can transmit a value of the volume of the sound in decibels in the form of an electrical signal to the adjuster module 408. The adjuster module 408 can then adjust the volume of the sound based on the value of the volume of the sound. In some embodiments, this process can repeat continuously so that the volume is currently being adjusted based on the environment at a present time. A method for this process is further explained in FIG. 5.

Figure 5:
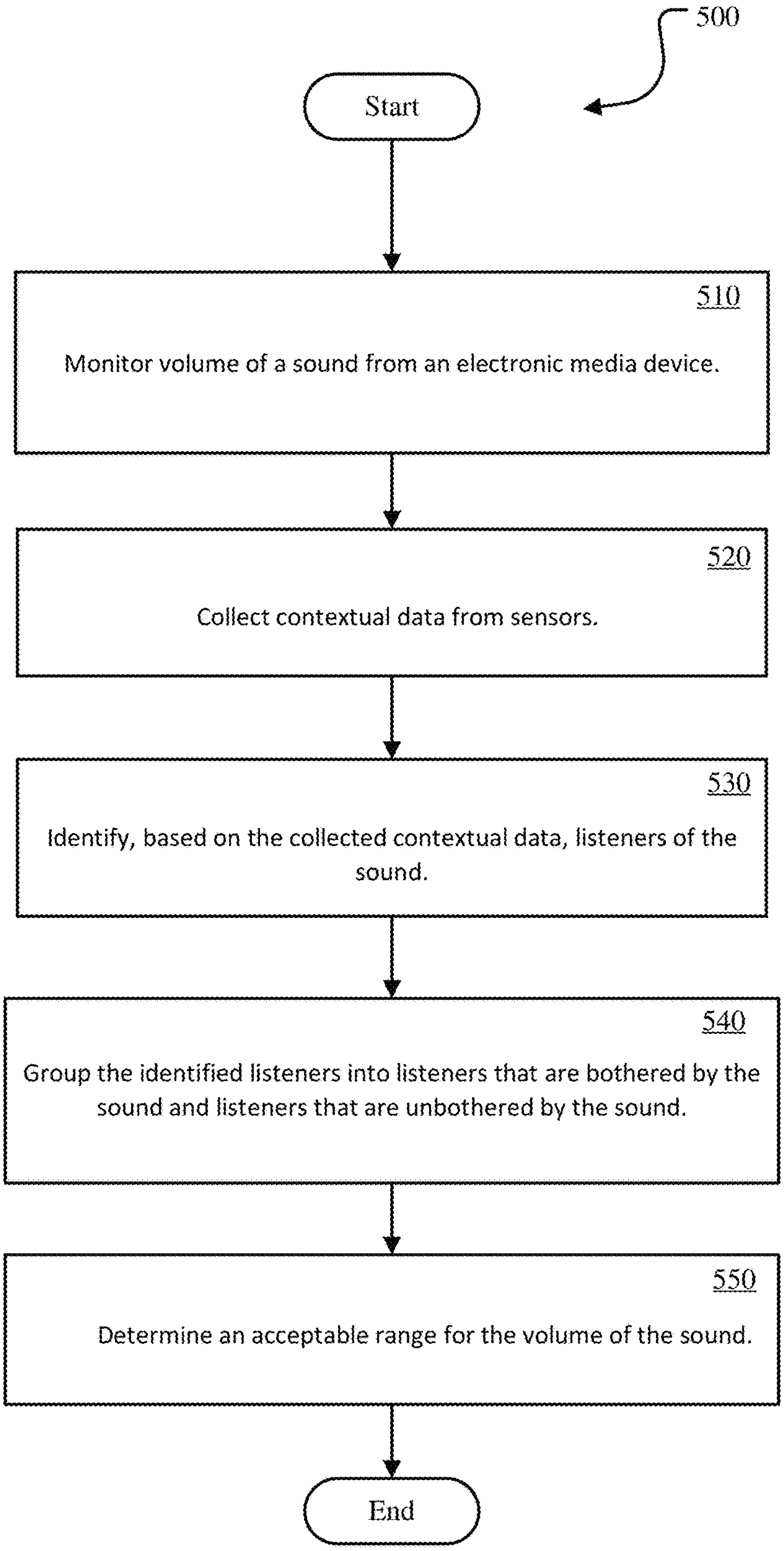
FIG. 5 depicts a method for adjusting a volume of a sound generated from an electronic media device based on contextual data, according to various embodiments.

Turning now to FIG. 5, a method for adjusting volume of a sound based on contextual data can be seen, according to various embodiments. In some embodiments, the method can include, in operation 510, monitoring a volume of a sound that is being generated from an electronic media device, e.g., electronic media device 420. In some embodiments, monitoring the electronic media device can be accomplished by an electronic audio instrument, e.g., volume monitor module 409. In some embodiments, the electronic audio instrument can continuously or discretely monitor the volume over time. The electronic audio instrument can be integrated within a casing that houses the electronic media device or within a close proximity of the electronic media device.

In some embodiments, operation 520 can include collecting contextual data from sensors. In some embodiments, the sensors can be within a room that is bounding an electronic media device. In some embodiments, the sensors can be in another room than the electronic media device. The sensors can collect video and audio data. The sensors can further collect data from, e.g., a database that is holding data that can relate to listeners that are nearby the electronic media device. For example, the database can be a mobile service provider, and the data can include the volume setting of a cell phone of a nearby listener. The volume setting can indicate the likelihood that the nearby listener could be bothered by a loud sound. For example, a mobile device with a volume setting on mute might suggest that the listener is in a meeting or that the listener does not want to be disturbed. An aggregation of nearby listeners that have their mobile device volume settings on mute might suggest that a meeting is being conducted and that they could be bothered by most noise. Data within a database can also include a listing of guests within a hotel for a night. The data can further include which rooms the hotel guests are occupying. The sensors could be further utilized in a moving vehicle. The sensors could identify an emergency vehicle approaching or within a close proximity of the moving vehicle. The sensors could also detect facial expressions, as well as verbal ques, that indicate that a listener could be bothered by a volume of a sound.

In some embodiments, the operation 530 can include identifying listeners of the sound. This identifying can be based on the contextual data that can be collected in operation 520. Identifying can include determining individuals that can hear the sound that is being generated by the electronic media device. This identifying can be accomplished through image or audio analysis techniques commonly known in the art. Image or audio analysis techniques can determine the volume of sound being generated by an electronic media device propagating through space to a position of an individual. For example, the sound being generated can reach two individuals standing relatively close, e.g., five feet from each other, but the generated sound may reach one of the individuals and not the other. The identifying can be performed by a, e.g., identifier module 404.

In some embodiments, the operation 540 can include grouping the identified listeners. The grouping can include partitioning listeners that are bothered by the sound into a first group and listeners that are unbothered by the sound into a second group. A third group can include listeners that are neutral, e.g., the third hotel guest 122 in FIG. 1. In some embodiments, the grouping can be useful information for increasing an accuracy of an acceptable volume that may not bother nearby listeners. In some embodiments, the grouping can be performed by a, e.g., grouping module 405.

In some embodiments, the operation 550 can include determining an acceptable range for the volume of the sound. In some embodiments, the determining can be performed by a, e.g., determiner module 406. The determiner module can base a determined acceptable range for the volume on the contextual data. The acceptable range can be set by a user. The range can be in units of decibels. In some embodiments, once the operation 550 has determined an acceptable range for the volume of the sound, the method 500 can conclude.

Figure 6:
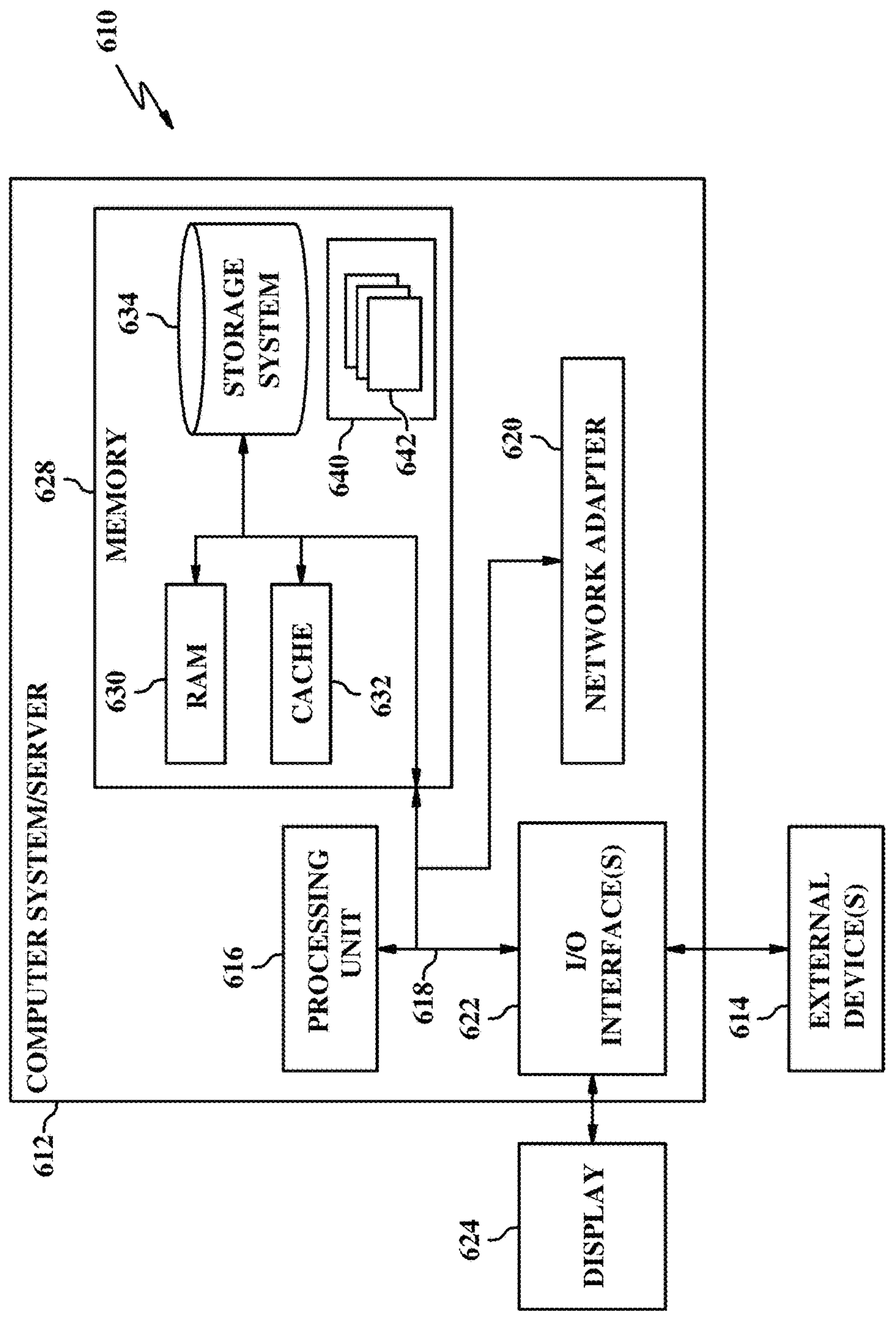
FIG. 6 illustrates a block diagram of a computer system that collects and analyzes data from motion sensors, according to various embodiments.

In some embodiments, the operations and modules described herein can be included within and performed by components of a computer (e.g., a processor), such as the computer system described in FIG. 6.

FIG. 6 depicts a high-level block diagram of a system for implementing embodiments of the disclosure. The mechanisms and apparatus of embodiments of the present disclosure apply equally to any appropriate computing system. The major components of the computer system 600 comprise one or more processors 606, a main memory 604, a terminal interface 610, a storage interface 612, an I/O (Input/Output) device interface 614, a user I/O device 624, and a storage device 626, all of which are communicatively coupled, directly or indirectly, for inter-component communication via a memory bus 618, an I/O bus 620, and an I/O bus interface unit 622.

The computer system 600 may contain one or more general-purpose programmable central processing units (CPUs) 606A, 606B, 606C, and 606D, herein generically referred to as the processor 606. In an embodiment, the computer system 600 contains multiple processors typical of a relatively large system; however, in another embodiment the computer system 600 may alternatively be a single CPU system. Each processor 606 executes instructions stored in the main memory 604 and may comprise one or more levels of on-board cache 630.

In an embodiment, the main memory 604 may comprise a random-access semiconductor memory, storage device, or storage medium (either volatile or non-volatile) for storing or encoding data and programs 634. In another embodiment, the main memory 604 represents the entire virtual memory of the computer system 600, and may also include the virtual memory of other computer systems coupled to the computer system 600 or connected via a network. The main memory 604 is conceptually a single monolithic entity, but in other embodiments the main memory 604 is a more complex arrangement, such as a hierarchy of caches 630 and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory 604 may store all or a portion of the following: RAM 632, cache 630, storage system 636, one or more programs/utilities 634, and at least one set of program modules 638. Although the RAM 632, cache 630, storage system 636, one or more programs/utilities 634, and at least one set of program modules 638 are illustrated as being contained within the memory 604 in the computer system 600, in other embodiments some or all of them may be on different computer systems and may be accessed remotely, e.g., via a network. The computer system 600 may use virtual addressing mechanisms that allow the programs of the computer system 600 to behave as if they only have access to a large, single storage entity instead of access to multiple, smaller storage entities. Thus, while the RAM 632, cache 630, storage system 636, one or more programs/utilities 638, and at least one set of program modules 638 are illustrated as being contained within the main memory 604, these components are not necessarily all completely contained in the same storage device at the same time. Further, although the RAM 632, cache 630, storage system 636, one or more programs/utilities 638, and at least one set of program modules 638 are illustrated as being separate entities, in other embodiments some of them, portions of some of them, or all of them may be packaged together.

In an embodiment, the memory 604 comprise instructions or statements that execute on the processor 606 or instructions or statements that are interpreted by instructions or statements that execute on the processor 606, to carry out the functions as further described with reference to the figures as discussed herein. For example, the memory 604 can store the approved set of motion data and can be compared to the first set of data by the processor 606. The memory 604 can store instructions for extracting information from one or more motion sensors 628, determining the one or more differences, score, as well as, for executing the reaction sequence. The memory 604 can store the information from one or more motion sensors 628 once the motion sensors 628 have been connected to the I/O device interface 614 of the computer system 600. The computer system 600 can be communicatively and connectively coupled to the hardware element. The terminal interface 610 can update the user with a real time analysis of the one or more actions being implemented in method 500.

In another embodiment, the main memory 604 are implemented in hardware via semiconductor devices, chips, logical gates, circuits, circuit cards, and/or other physical hardware devices in lieu of, or in addition to, a processor-based system. In an embodiment, the main memory 604 comprise data in addition to instructions or statements.

The memory bus 618 provides a data communication path for transferring data among the processor 606, the main memory 604, and the I/O bus interface 622. The I/O bus interface 622 is further coupled to the I/O bus 620 for transferring data to and from the various I/O units. The I/O bus interface unit 622 communicates with multiple I/O interface units 610, 612, 614, 624, and 626 which are also known as I/O processors (IOPs) or I/O adapters (IOAs), through the I/O bus 620.

The I/O interface units support communication with a variety of storage and I/O devices. For example, the terminal interface unit 610 supports the attachment of one or more user I/O devices 624, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 624 and the computer system 600, and may receive output data via the user output devices. For example, a user interface may be presented via the user I/O device 624, such as displayed on a display device, played via a speaker, or printed via a printer.

The storage interface 612 supports the attachment of one or more disk drives or direct access storage devices 626 (which are typically rotating magnetic disk drive storage devices, although they could alternatively be other storage devices, including arrays of disk drives configured to appear as a single large storage device to a host computer). In another embodiment, the storage device 626 may be implemented via any type of secondary storage device. The contents of the main memory 604, or any portion thereof, may be stored to and retrieved from the storage device 626, as needed. The I/O device interface 614 provides an interface to any of various other input/output devices or devices of other types, such as printers or fax machines. The network interface provides one or more communications paths from the computer system 600 to other digital devices and computer systems; such paths may comprise, e.g., one or more networks.

Although the memory bus 618 is shown in FIG. 6 as a relatively simple, single bus structure providing a direct communication path among the processors 606, the main memory 604, and the I/O bus interface 622, in fact the memory bus 618 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 622 and the I/O bus 620 are shown as single respective units, the computer system 600 may, in fact, contain multiple I/O bus interface units 622 and/or multiple I/O buses 620. While multiple I/O interface units are shown, which separate the I/O bus 620 from various communications paths running to the various I/O devices, in other embodiments some or all of the I/O devices are connected directly to one or more system I/O buses.

In various embodiments, the computer system 600 is a multi-user mainframe computer system, a single-user system, or a server computer or similar device that has little or no direct user interface, but receives requests from other computer systems (clients). In other embodiments, the computer system 600 is implemented as a desktop computer, portable computer, laptop or notebook computer, tablet computer, pocket computer, telephone, smart phone, or any other appropriate type of electronic device.

FIG. 6 is intended to depict the representative major components of the computer system 600. But, individual components may have greater complexity than represented in FIG. 6, components other than or in addition to those shown in FIG. 6 may be present, and the number, type, and configuration of such components may vary. Several particular examples of such additional complexity or additional variations are disclosed herein; these are by way of example only and are not necessarily the only such variations. The various program components illustrated in FIG. 6 and implementing various embodiments of the invention may be implemented in a number of manners, including using various computer applications, routines, components, programs, objects, modules, data structures, etc., and are referred to herein as "software," "computer programs," or simply "programs."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:

monitoring volume of a sound, the sound being generated from a source;

collecting contextual data from sensors;

identifying, based on the collected contextual data, listeners of the sound;

grouping the identified listeners into listeners that are bothered by the sound and listeners that are unbothered by the sound;

determining, based on the bothered listeners and the unbothered listeners, an acceptable range for the volume of the sound;

determining a maximal tolerable volume (MTV) for the volume of the sound based on the collected contextual data;

adjusting the volume in response to the volume satisfying an MTV threshold;

displaying, within a UI, the acceptable range for the volume of the sound to reside within so that the identified listeners remain unbothered, wherein the acceptable range is depicted as a linear volume control that depicts noise thresholds, wherein the noise thresholds are depicted by different color segments of the linear volume control that indicate when the volume exceeds the MTV for the identified listeners; and presenting a user with visual and auditory feedback of the identified listeners collected from the sensors from an immediate environment surrounding the user.

2. The method of claim 1, wherein the acceptable range for the volume of the sound is based on a number of bothered listeners and a number of unbothered listeners.

3. The method of claim 1, wherein the contextual data is used to differentiate bothered listeners from unbothered listeners.

4. The method of claim 1, wherein the sensors are selected from a group consisting of three dimensional cameras, two dimensional cameras, audio recorders, and motion sensors.

5. The method of claim 1, the method further comprising:

weighting, based on the contextual data, the bothered listeners and the unbothered listeners; and aggregating, in response to the weighting, the bothered listeners and the unbothered listeners, wherein the determining the acceptable range of volume is based on the weighting.

6. The method of claim 1, wherein the source is an electronic media device.

7. The method of claim 1, the method further comprising:

determining, based on the monitoring the volume of the sound, a current volume of the sound being generated from the source; and adjusting automatically, based on the acceptable range of the volume of the sound, the current volume of the sound being generated from the source.

8. The method of claim 1, the method further comprising:

setting, based on a preference of a user, a level of bothered;

tracking one or more bothered listeners within an area surrounding the source; and maintaining automatically the level of bothered, by adjusting the volume of the sound, as one or more bothered listeners change geographic location.

9. The method of claim 1, wherein the determining the acceptable range of the volume is further based on a characteristic of the bothered listeners and unbothered listeners, and wherein the method further comprises:

determining, based on the contextual data, the characteristic of the bothered listeners and unbothered listeners, wherein the characteristic is based on age.

10. The method of claim 1, wherein the determining the acceptable range of the volume is further based on a characteristic of each listener, and wherein the method further comprises:

determining, based on the contextual data, the characteristic of each listener, wherein the characteristic is based on a volume setting of each mobile device that each listener is using.

11. The method of claim 1, wherein the determining the acceptable range of the volume is further based on a characteristic of the bothered listeners and unbothered listeners, and wherein the method further comprises:

determining, based on the contextual data, the characteristic of the bothered listeners and unbothered listeners, wherein the characteristic is based on a schematic that includes information of a building that is enclosing the source of the sound.

12. The method of claim 11, wherein the information includes a list of rooms in the building that are occupied and rooms in the building that are unoccupied.

13. A system for monitoring a volume of a sound, the system comprising:

a processor; and a computer readable storage medium having program instructions embodied therewith, the program instructions executable by the processor to cause the system to:

monitor volume of a sound, the sound being generated from a source;

collect contextual data from sensors;

identify, based on the collected contextual data, listeners of the sound;

group the identified listeners into listeners that are bothered by the sound and listeners that are unbothered by the sound;

determine, based on the bothered listeners and the unbothered listeners, an acceptable range for the volume of the sound;

determining a maximal tolerable volume (MTV) for the volume of the sound based on the collected contextual data;

adjusting the volume in response to the volume satisfying an MTV threshold;

displaying, within a UI, the acceptable range for the volume of the sound to reside within so that the identified listeners remain unbothered, wherein the acceptable range is depicted as a linear volume control that depicts noise thresholds, wherein the noise thresholds are depicted by different color segments of the linear volume control that indicate when the volume may likely exceed the MTV for the identified listeners; and presenting a user with visual and auditory feedback of the identified listeners collected from the sensors from an immediate environment surrounding the user.

14. The system of claim 13, wherein the acceptable range for the volume of the sound is based on a number of bothered listeners and a number of unbothered listeners.

15. The system of claim 13, wherein the contextual data is used to differentiate bothered listeners from unbothered listeners.

16. A computer program product for monitoring a volume of a sound, the computer program product comprising a computer readable storage medium having program instructions embodied therewith, wherein the computer readable storage medium is not a transitory signal per se, the program instructions executable by a computer to perform a method comprising:

monitoring volume of a sound, the sound being generated from a source;

collecting contextual data from sensors;

identifying, based on the collected contextual data, listeners of the sound;

grouping the identified listeners into listeners that are bothered by the sound and listeners that are unbothered by the sound;

determining, based on the bothered listeners and the unbothered listeners, an acceptable range for the volume of the sound;

determining a maximal tolerable volume (MTV) for the volume of the sound based on the collected contextual data;

adjusting the volume in response to the volume satisfying an MTV threshold;

displaying, within a UI, the acceptable range for the volume of the sound to reside within so that the identified listeners remain unbothered, wherein the acceptable range is depicted as a linear volume control that depicts noise thresholds, wherein the noise thresholds are depicted by different color segments of the linear volume control that indicate when the volume may likely exceed the MTV for the identified listeners; and presenting a user with visual and auditory feedback of the identified listeners collected from the sensors from an immediate environment surrounding the user.

17. The computer program product of claim 16, wherein the acceptable range for the volume of the sound is based on a number of bothered listeners and a number of unbothered listeners.

18. The computer program product of claim 16, wherein the contextual data is used to differentiate bothered listeners from unbothered listeners.

* * * * *